United States Patent
Chalupper et al.

(10) Patent No.: US 8,116,491 B2
(45) Date of Patent: Feb. 14, 2012

(54) METHOD FOR THE DYNAMIC RANGE COMPRESSION OF AN AUDIO SIGNAL AND CORRESPONDING HEARING DEVICE

(75) Inventors: Josef Chalupper, Paunzhausen (DE); Markus Fruhmann, München (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 1169 days.

(21) Appl. No.: 11/906,509

(22) Filed: Oct. 2, 2007

(65) Prior Publication Data
US 2009/0287492 A1     Nov. 19, 2009

(30) Foreign Application Priority Data
Oct. 9, 2006   (DE) .......................... 10 2006 047 694

(51) Int. Cl.
*H04R 25/00*   (2006.01)
(52) U.S. Cl. ........................................ 381/320; 381/312
(58) Field of Classification Search .................. 381/312, 381/320, 321
See application file for complete search history.

(56) References Cited

U.S. PATENT DOCUMENTS
| | | | |
|---|---|---|---|
| 6,198,830 B1 * | 3/2001 | Holube et al. | ................. 381/321 |
| 2003/0044034 A1 | 3/2003 | Zeng et al. | |
| 2006/0087380 A1 | 4/2006 | Hohmann | |

FOREIGN PATENT DOCUMENTS
| | | |
|---|---|---|
| DE | 10 2004 044 565 A1 | 3/2006 |
| DE | 197 03 228 B4 | 8/2006 |
| WO | 9965276 A1 | 12/1999 |

OTHER PUBLICATIONS
Qin Li and Les Atlas, "Properties for Modulation Spectral Filtering", IEEEE International Conference on Acoustics, Speech and Signal Processing, 2005, pp. 521-524.

* cited by examiner

*Primary Examiner* — Brian Ensey

(57) ABSTRACT

It should be possible to carry out dynamic range compression in hearing devices, and in particular in hearing aids, so it is free from distortion and practically in real time. For this purpose it is proposed that the modulation spectrum be obtained from the audio or input signal. The modulation spectrum is subsequently directly modified corresponding to a predefined compression function. Finally a modified or compressed output signal is recovered from the modified modulation spectrum. Alternatively a complex envelope may be obtained from the input signal, which is filtered using time-variant modulation filtering corresponding to a predefined compression rule. A distortion-free, compressed output signal may also be recovered herefrom.

16 Claims, 4 Drawing Sheets

METHOD FOR THE DYNAMIC RANGE COMPRESSION OF AN AUDIO SIGNAL AND CORRESPONDING HEARING DEVICE

CROSS REFERENCE TO RELATED APPLICATIONS

This application claims priority of German application No. 10 2006 047 694.8 filed Oct. 9, 2006, which is incorporated by reference herein in its entirety.

FIELD OF THE INVENTION

The present invention relates to a method for the dynamic range compression of an audio signal and to a corresponding hearing device. The term hearing device is in this case generally taken to mean a portable or non-portable audio apparatus, in particular a hearing aid, a headset or headphones.

BACKGROUND OF THE INVENTION

Hearing aids are portable hearing devices which are used to supply the hard-of-hearing. To accommodate the numerous individual needs, different hearing aid constructions, such as behind-the-ear (BTE) hearing aids, in-the-ear hearing aids (ITE) and concha hearing aids are provided. The hearing aids listed by way of example are worn on the outer ear or in the auditory canal. There are however also bone conduction hearing aids, implantable or vibrotactile hearing aids available on the market. In this case, the damaged ear is stimulated either mechanically or electrically.

Basically hearing aids possess as fundamental components an input transducer, an amplifier and an output transducer. The input transducer is usually a receiving transducer, for example a microphone, and/or an electromagnetic receiver, for example an induction coil. The output transducer is usually implemented as an electroacoustic transducer, for example a miniature loudspeaker, or as an electromechnical transducer, for example bone conduction earpiece. The amplifier is conventionally integrated in a signal processing unit. FIG. 1 shows this basic construction using the example of a behind-the-ear hearing aid. One or more microphone(s) 2 for receiving the sound from the environment are fitted into a hearing aid casing 1 for wearing being the ear. A signal processing unit 3, which is also integrated in the hearing aid casing 1, processes the microphone signals and amplifies them. The output signal of the signal processing unit 3 is transmitted to a loudspeaker or earpiece 4 which outputs an acoustic signal. The sound is optionally transmitted via an acoustic tube, which is fixed by an otoplastic in the auditory canal, to the ear drum of the hearing aid wearer. The power supply to the hearing aid, and in particular that of the signal processing unit 3, is provided by a battery 5 that is also integrated in the hearing aid casing 1.

Audio signals have a specific dynamic range which characterizes the difference between the lowest and the highest levels. Naturally occurring audio signals usually have a high dynamic range while audio equipment, such as radio equipment and hearing aids, have a much lower dynamic range in their output signal. For this reason a dynamic range compression is carried out in the case of said devices or corresponding processing methods.

Dynamic range compression is a non-linear method. Audible distortions therefore occur, in particular in the case of fast recovery time constants, which lead to a reduction in sound quality. The "effective compression" also decreases with increasing modulation frequency owing to the inertia of the control system. For natural signals it is therefore almost impossible to predict the effective compression rate or purposefully adjust it as a function of the modulation frequency. The first problem of distortions in the case of fast recovery time constants can be avoided by appropriately slow control. The second problem of inertia in the control system if anything requires fast control however, and this contradicts said solution to the first problem.

A coherent demodulation for obtaining a complex envelope is known from the article "PROPERTIES FOR MODULATION SPECTRAL FILTERING", Qin Li and Les Atlas, ICASSP 2005, pages 521 to 524.

From patent specification DE 197 03 228 B4 a method for amplifying input signals of a hearing aid is known in which to ensure dynamic range compression, in addition to detecting the signal level of the input signal, a modulation frequency analysis is carried out.

Document DE 10 2004 044 565 A1 also describes a method for limiting the dynamic range of audio signals. In this case the dynamic range limitation is regulated as a function of the instantaneous frequency of the audio signal for compression.

SUMMARY OF THE INVENTION

The object of the present invention lies in being able to carry out a dynamic range compression as far as possible without distortions and in real time.

According to the invention this object is achieved by a method for dynamic compression of an audio signal by determining a modulation spectrum of the audio signal, modifying the modulation spectrum corresponding to a predefined compression function and recovering a modified audio signal from the modified modulation spectrum.

According to the invention a hearing device, comprising a first processing device for determining a modulation spectrum of an audio signal, a modification device for modifying the modulation spectrum corresponding to a predefined compression function for a dynamic range compression of the audio signal and a second processing device for recovering a modified audio signal from the modified modulation spectrum is also provided.

Advantageously no compression is therefore carried out in the time or frequency range but directly in the modulation spectrum. While distortions occur in the modulation spectrum in the case of conventional dynamic range compression systems, distortions can be prevented in the modulation spectrum using the inventive approach since the modulation spectrum is directly modified. Direct modification of the modulation spectra can also directly adjust the desired effective compression rate.

The inventive dynamic range compression is preferably separately carried out in a plurality of frequency channels. The compression rates can be very selectively chosen in the individual frequency channels thereby.

According to a particular embodiment the modulation spectrum is determined from a complex envelope of the audio signal obtained by coherent demodulation. The phase information of the envelope can thus be prevented from being lost during compression.

According to a further embodiment the modulation spectrum is ascertained by estimation using instantaneous frequency determination of the envelope modulation. Complex calculation algorithms can be avoided by estimation.

Estimation can take place in real time using one or more oscillation detector(s). Estimates of the modulation spectrum may thus be obtained quickly and easily.

The above-mentioned object is also achieved by a method for dynamic range compression of an audio signal by obtaining a complex envelope of the audio signal, time-variant modulation filtering of the complex envelope corresponding to a predefinable compression rule and recovering a modified audio signal from the filtered envelope.

According to the invention a corresponding hearing device, comprising a first processing device for obtaining a complex envelope of an audio signal, a filter for time-variant modulation filtering of the complex envelope corresponding to a predefinable compression rule and a second processing device for recovering a modified audio signal from the filtered envelope, is also provided.

Modulation filtering is preferably controlled by the instantaneous frequency of the envelope. The quality of modulation filtering is also improved by the fact that it is controlled by a current level of the envelope.

It is advantageous to separately carry out the dynamic range compression in a plurality of frequency channels in this solution of time-variant modulation filtering as well.

BRIEF DESCRIPTION OF THE DRAWINGS

The present invention is described in more detail with reference to the accompanying drawings, in which.

DETAILED DESCRIPTION OF THE INVENTION

The exemplary embodiments described in more detail hereinafter are preferred embodiments of the present invention.

Figure 1:
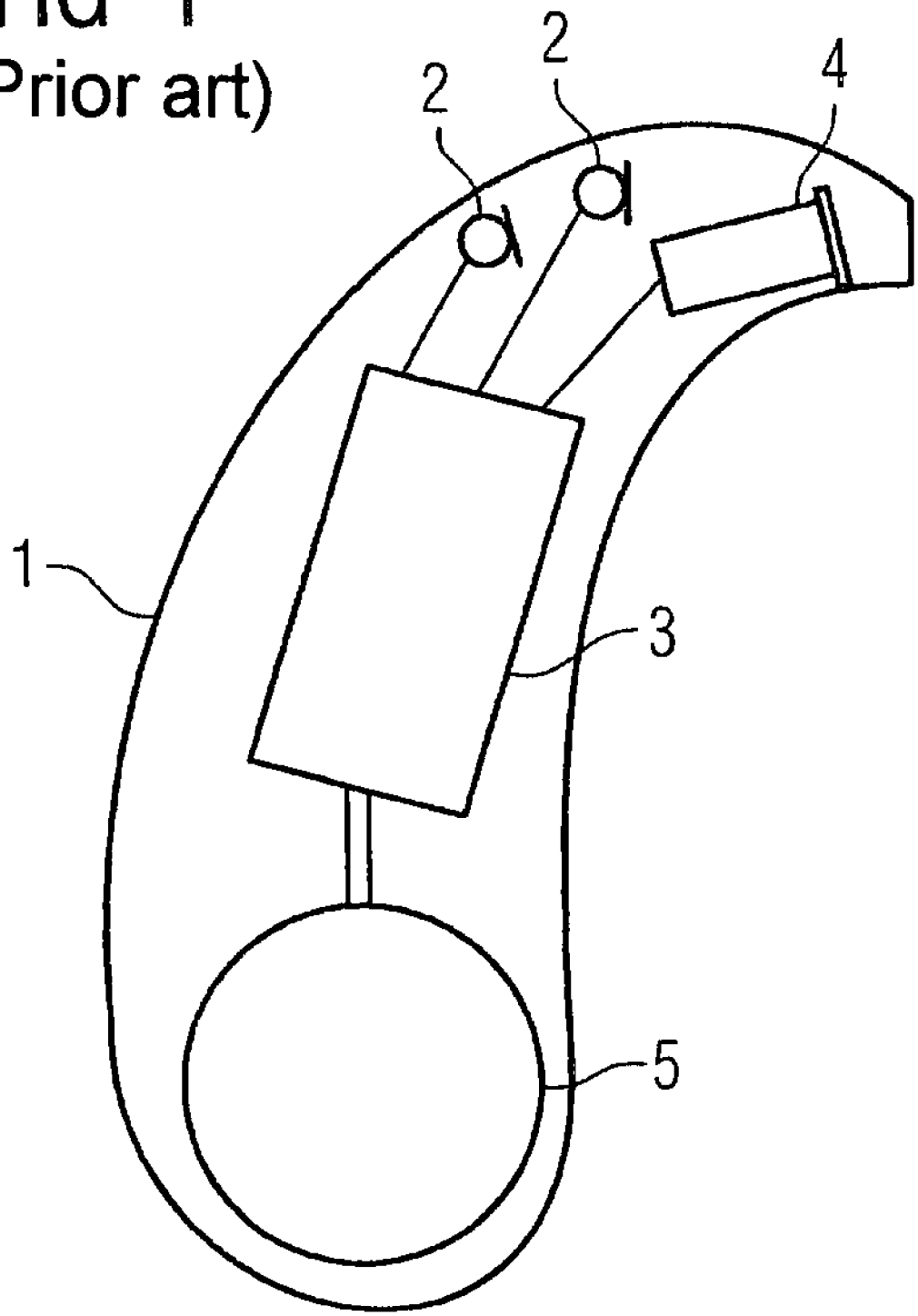
FIG. 1 shows a hearing aid with its fundamental electronic components.
Figure 2:
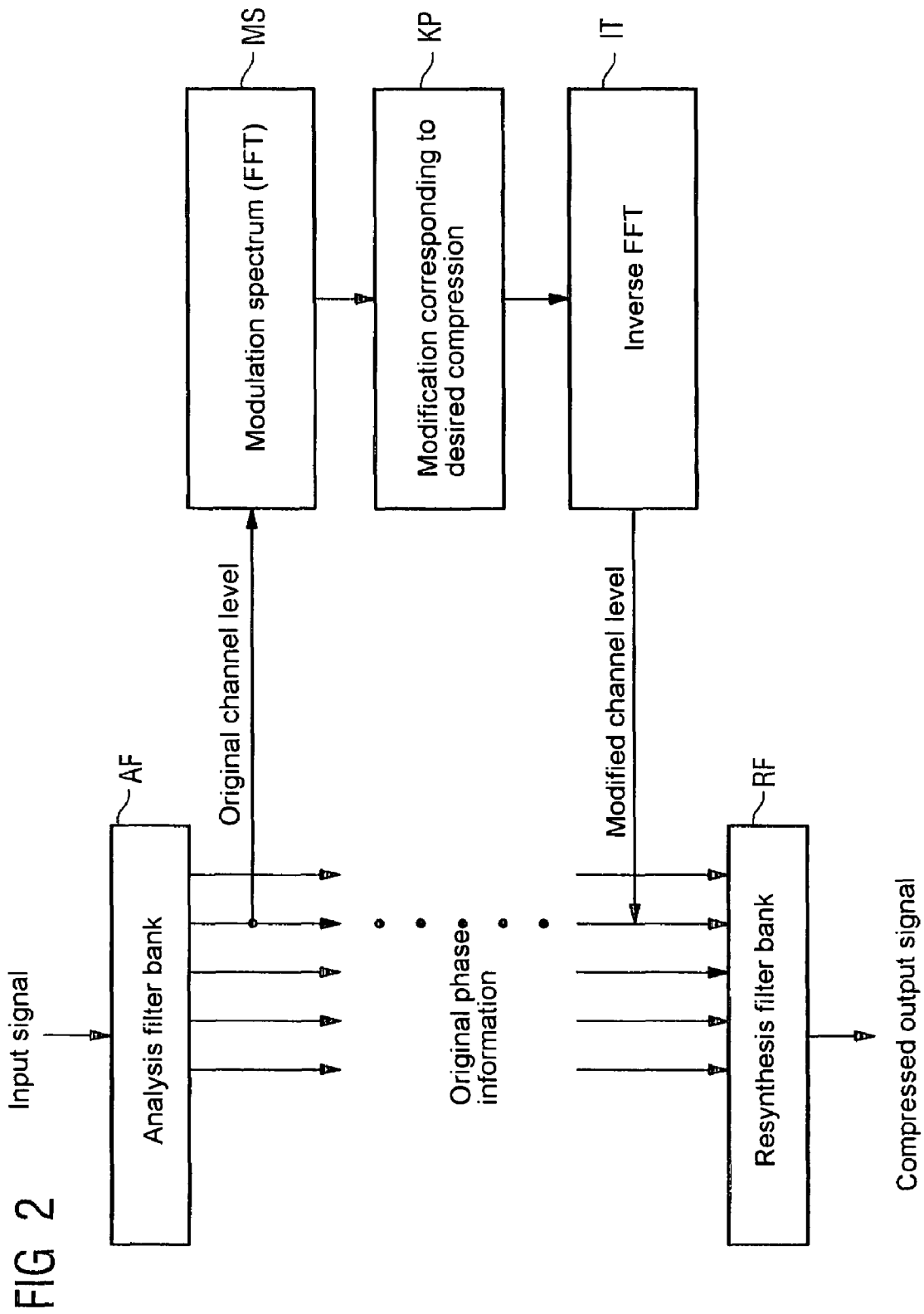
FIG. 2 shows a block diagram according to a first embodiment of a dynamic range compression.

The block diagram reproduced in FIG. 2 symbolizes a first exemplary embodiment of the present invention in which the modulation spectrum is obtained by FFT (Fast Fourier Transformation). First of all however the input signal is separated into its frequency bands. This also takes place for example by way of an FFT or, as in the example shown in FIG. 2, by an analysis filter bank AF. The signals in the individual frequency channels with the original phase information result therefrom.

FIG. 2 accordingly shows the processing of one of these frequency channels, the corresponding signal having an original channel level. The modulation spectrum is calculated for the corresponding channel in short, overlapping time slots ("Overlap add") in an adjoining unit MS. The FFT is again used for this purpose. The modulation spectrum is subsequently modified corresponding to the desired compression rate in a unit KP. For this purpose a target modulation spectrum is directly calculated as a function of the modulation frequency using the desired effective compression rate. In a succeeding inverse transformation unit IT the envelope of the corresponding channel and time slot is calculated by inverse FTT ("Overlap add") from this target modulation spectrum. This envelope represents the modified channel level and is recombined with the phases in a Resynthesis filter bank RF, so a time signal again results.

The compression is therefore carried out directly in the modulation spectrum, so distortions can be prevented for the most part.

The dynamic range compression corresponding to the first exemplary embodiment of FIG. 2 can however have drawbacks under certain conditions. On the one hand determination of the modulation spectrum requires a time slot. There is the problem in this case of finding an optimal compromise for the length of the time slot. If the slot is too short long modulation frequencies are not resolved, and this means poor frequency resolution. If the slot is too long on the other hand, this leads to an additional delay and therewith to poor hearing aid sound quality as a result of interactions with direct sound. Lip reading is rendered more difficult hereby. A solution to this problem lies for example in estimating the modulation spectrum using instantaneous frequency determination (for example using one or more oscillation detector(s)) of the envelope modulations. For this purpose the block MS of FIG. 2 is replaced by a corresponding estimation unit which will be described in more detail below.

Figure 3:
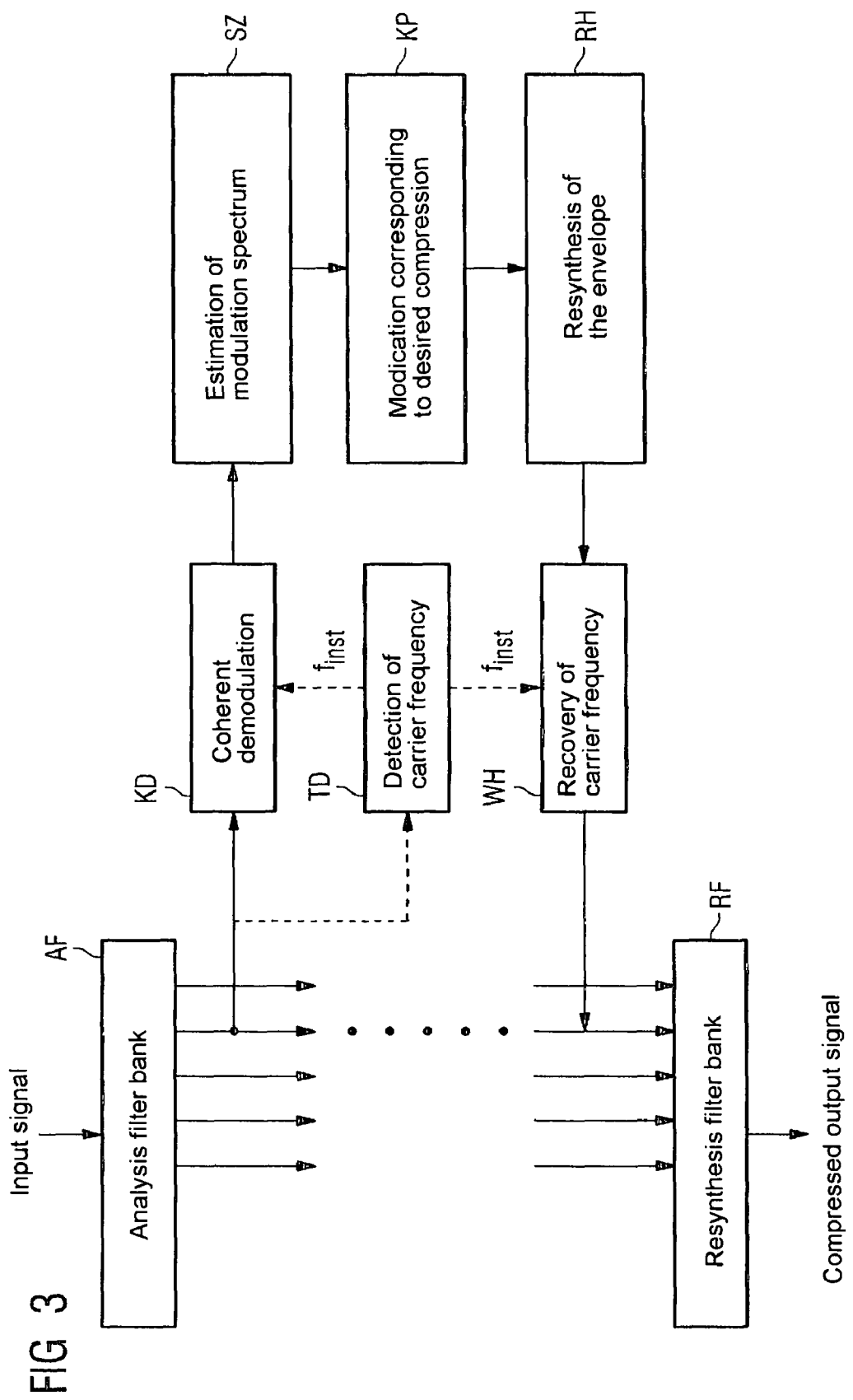
FIG. 3 shows a block diagram of a second exemplary embodiment of an inventive dynamic range compression.

A further problem of the embodiment of FIG. 2 can sometimes lie in the fact that modifications in the modulation spectrum lead to (new) distortions. This problem is addressed in the above-mentioned article "PROPERTIES FOR MODULATION SPECTRAL FILTERING". A solution of this problem consists in using improved methods for envelope and carrier estimation, for example complex envelope detection. The second exemplary embodiment according to FIG. 3 has developed from the above-mentioned methods of resolution. As in the example of FIG. 2 the input signal is first of all broken down into frequency channels in an analysis filter bank AF. The signal of each channel is then subjected to a coherent demodulation in a unit KD, whereby a complex envelope may be obtained. The instantaneous frequency $f_{inst}$ is required to control this coherent demodulation KD. This is obtained by a carrier frequency detector TD which analyzes the signal of the respective channel.

The complex envelope is fed to an estimation unit SZ which estimates the modulation spectrum therefrom. As in the example of FIG. 2 the modulation spectrum is modified corresponding to a desired compression rate in a compression unit KP. A modified envelope is thereafter obtained in a resynthesis unit RH.

A carrier frequency in the respective channel is recovered in a recovery unit WH on the basis of the instantaneous frequency $f_{inst}$. The envelope information from the resynthesis unit RH is used for this purpose. The output signal of the recovery unit WH corresponds to a modified channel level which is used in the resynthesis filter bank RF to produce the compressed output signal that ultimately results.

Figure 4:
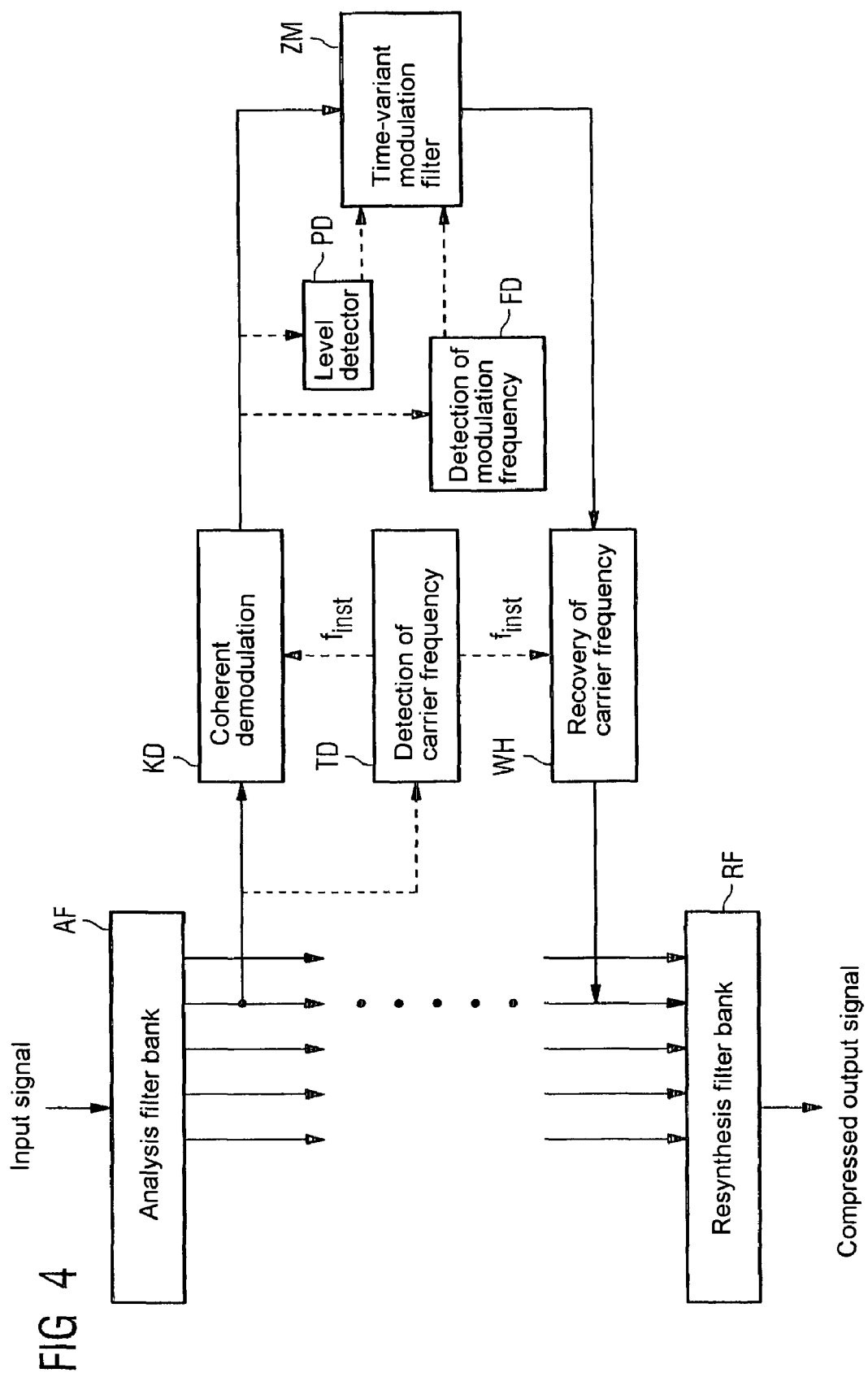
FIG. 4 shows a block diagram of a third exemplary embodiment of an inventive dynamic range compression.

Finally, FIG. 4 shows a third embodiment of a signal processing unit for carrying out the inventive dynamic range compression. The construction of the processing unit symbolized in FIG. 4 corresponds in the left-hand and middle parts to that in FIG. 3. This means that a complex envelope signal is also produced hereby from the input signal by coherent demodulation KD. However, the modulation spectrum is not estimated or calculated from the complex envelope but is processed further in the time range. A time-variant modulation filter ZM takes over the complex envelope in this case. At the same time the level is determined by a level detector PD and the modulation frequency by an oscillation detector or frequency detector FD from the complex envelope. The current level and the current modulation frequency are used to control the time-variant modulation filter ZM. The time-variant modulation filter ZM has already been provided in advance with the corresponding compression value or values. In the case of a hearing aid the compression value or values have been individually determined during adjustment to the hearing aid wearer. Finally the time-variant modulation filter ZM changes the envelope as a function of the current level and the current modulation frequency by taking account of the desired dynamic range compression. The output signal is fed to the recovery unit WH as already illustrated above.

A dynamic range compression can thus be achieved practically in real time without significant distortions.

The invention claimed is:

1. A method for dynamic range compression of an audio signal, comprising:
   determining a modulation spectrum of the audio signal;
   modifying the modulation spectrum corresponding to a predefined compression function; and
   recovering a modified audio signal from the modified modulation spectrum,
   wherein the modulation spectrum is calculated by Fast Fourier Transformation.

2. The method as claimed in claim 1, wherein the dynamic range compression is separately carried out in a plurality of frequency channels.

3. The method as claimed in claim 1, wherein the modulation spectrum is determined from a complex envelope of the audio signal obtained by coherent demodulation.

4. The method as claimed in claim 3, wherein the complex envelope of the audio signal is time-variant modulation filtered corresponding to the predetermined compression function.

5. The method as claimed in claim 4, wherein a modified audio signal is recovered from the filtered envelope.

6. The method as claimed in claim 4, wherein the modulation filtering is controlled by an instantaneous frequency of the envelope.

7. The method as claimed in claim 4, wherein the modulation filtering is controlled by a current level of the envelope.

8. The method as claimed in claim 1, wherein the modulation spectrum is estimated by an instantaneous frequency determination.

9. The method as claimed in claim 8, wherein the estimation takes place in real time using an oscillation detector.

10. A hearing device, comprising:
    a first processing device that determines a modulation spectrum of an audio signal;
    a modulation device that modifies the modulation spectrum corresponding to a predefined compression function for a dynamic range compression of the audio signal;
    a second processing device that recovers a modified audio signal from the modified modulation spectrum; and
    a demodulator that determines a complex envelope of the audio signal by a coherent demodulation.

11. The hearing device as claimed in claim 10, wherein the first processing device comprises an estimation unit that determines the modulation spectrum by an instantaneous frequency determination.

12. The hearing device as claimed in claim 11, wherein the estimation unit comprises an oscillation detector to determine a frequency of the audio signal.

13. The hearing device as claimed in claim 10, further comprising an analysis filter bank and a resynthesis filter bank that separate the processing in a plurality of frequency channels.

14. A hearing device, comprising
    a first processing device that determines a complex envelope of an audio signal;
    a filter that time-variant modulation filters the complex envelope corresponding to a predefined compression rule;
    a second processing device that recovers a modified audio signal from the filtered envelope; and
    an analysis filter bank and a resynthesis filter bank that separate the processing in a plurality of frequency channels.

15. The hearing device as claimed in claim 14, wherein the filter is controlled by a modulation frequency detector that detects an instantaneous frequency of the envelope.

16. The hearing device as claimed in claim 14, wherein the filter is controlled by a level detector that detects a current level of the envelope.

* * * * *